(12) United States Patent
Oishi et al.

(10) Patent No.: US 7,476,898 B2
(45) Date of Patent: Jan. 13, 2009

(54) THIN FILM AND MANUFACTURING METHOD OF THE SAME

(75) Inventors: Mitsuma Oishi, Kanagawa (JP); Masayuki Uehara, Kanagawa (JP)

(73) Assignee: NEC LCD Technologies, Ltd., Kawasaki, Kanagawa (JP)

( * ) Notice: Subject to any disclaimer, the term of this patent is extended or adjusted under 35 U.S.C. 154(b) by 0 days.

(21) Appl. No.: 11/104,424

(22) Filed: Apr. 13, 2005

(65) Prior Publication Data
US 2005/0230685 A1 Oct. 20, 2005

(30) Foreign Application Priority Data
Apr. 14, 2004 (JP) ............... 2004-118881

(51) Int. Cl.
*H01L 21/84* (2006.01)
(52) U.S. Cl. ............... 257/72; 257/59; 257/E21.414; 257/E29.28; 257/E29.291; 438/149; 438/151
(58) Field of Classification Search ........... 257/72, 257/59; 438/149, 151
See application file for complete search history.

(56) References Cited

U.S. PATENT DOCUMENTS

| | | | | |
|---|---|---|---|---|
| 6,825,893 | B2 * | 11/2004 | Choi | 349/43 |
| 2001/0040648 | A1 * | 11/2001 | Ono et al. | 349/43 |
| 2004/0223107 | A1 * | 11/2004 | Anno et al. | 349/143 |
| 2005/0173762 | A1 * | 8/2005 | Ohishi et al. | 257/347 |
| 2005/0176226 | A1 * | 8/2005 | Young | 438/533 |

FOREIGN PATENT DOCUMENTS

| | | |
|---|---|---|
| JP | 2001-164886 | 6/2000 |
| JP | 2001-296557 | 10/2001 |
| JP | 2001-324725 | 11/2001 |
| JP | 2002-83971 | 3/2002 |
| JP | 2002-258324 | 9/2002 |
| JP | 2003-309269 | 10/2003 |
| JP | 2004-34094 | 2/2004 |

OTHER PUBLICATIONS

Japanese Office Action dated Apr. 1, 2008, with partial English Translation.

* cited by examiner

*Primary Examiner*—Ahmed Sefer
(74) *Attorney, Agent, or Firm*—McGinn IP Law Group, PLLC

(57) ABSTRACT

A TFT of the present invention includes a gate electrode, a gate insulating film and a first semiconductor film which are sequentially formed on an insulating substrate, a second semiconductor film including a high density impurity which is formed on the first semiconductor film while being separated into portions at grade and a first electrode and a second electrode, each of which is formed on the separated second semiconductor film. Further, a peripheral portion of the first semiconductor film includes a protruded portion toward the outside from an edge of the second semiconductor film, and a surface of the protruded portion is roughened. By roughening the surface of the protruded portion, an on-current of the TFT can be maintained and the leakage current can be suppressed.

12 Claims, 8 Drawing Sheets

THIN FILM AND MANUFACTURING METHOD OF THE SAME

BACKGROUND OF THE INVENTION

1. Field of the Invention

The present invention relates to a thin film transistor and a manufacturing method thereof and, more particularly, to a thin film transistor having an inversely staggered configuration and a manufacturing method thereof.

2. Description of the Related Art

Liquid crystal display devices using thin film transistors (TFTs) as switching elements are widely proliferated in the marketplace, and as to a TFT using amorphous silicon (a-Si) for a semiconductor film, an inversely staggered configuration is widely adopted.

In a manufacturing method of a TFT which is formed by etching a channel (hereinafter referred to as a channel etch type TFT), a conductive layer to be formed as source and drain electrodes is etched by use of resist masks and is separated into a source electrode and a drain electrode. Further, $n^+$ a-Si for forming an ohmic contact is etched to separate a source electrode contact and a drain electrode contact, and a TFT is formed. As to the manufacturing method of this channel etch type TFT, a manufacturing method using photomasks four times is adopted in order to reduce the number of process steps.

For instance, in Japanese Patent Laid-open No. 2000-164886 (hereinafter referred to as Patent Document 1), disclosed is a manufacturing method of a channel etch type TFT using photomasks four times as follows. FIG. 1A is a cross-sectional view showing the channel etch type TFT which is manufactured by the manufacturing method disclosed in Patent Document 1. With reference to FIG. 1A, the manufacturing method of the TFT is described. First, an electric conductor such as a metal is formed as a film on an insulating substrate 100. Patterning this conductor with lithography and etching technologies forms gate wiring and a gate electrode 101. Next, a gate insulating film 102 is formed on the insulating substrate 100, gate wiring and gate electrode 101. An a-Si film 103, an $n^+$ a-Si film 104 and a metal film for source and drain electrodes are formed step by step on this gate insulating film 102. Reference numerals 105 and 106 denote the drain and source electrodes respectively, which are formed by patterning the metal film.

Next, by use of lithography technology, on the metal film for the source and drain electrodes, formed is a resist (not shown) which is thick in the areas forming source and drain electrodes and thin in the area between the areas in which the source and drain electrodes are formed. By using this resist as a mask, the metal film for the source and drain electrodes, the $n^+$ a-Si film 104 and the a-Si film 103 are etched to perform a first patterning of the source electrode 106, drain electrode 105, a-Si film 103 and $n^+$ a-Si film 104. When the $n^+$ a-Si film 104 and a-Si film 103 are etched, at the same time the resist is etched so that the thin resist between the areas forming source and drain electrodes is removed thereby. The thick resist covering the forming areas of source electrode 106 and drain electrode 105 is etched such that the thickness thereof is reduced but the resist itself stays remained. By the use of this remaining resist as a mask, the metal film for the source and drain electrodes which is exposed between the forming areas of source electrode 106 and drain electrode 105 is etched. Further, the $n^+$ a-Si film 104 between the forming areas of source electrode 106 and drain electrode 105 is etched, and a second patterning of the source electrode 106, drain electrode 105 and $n^+$ a-Si film 104 is performed. Thereafter, the resist is removed.

Next, a passivation film 107 is formed all over the surface over the insulating substrate 100. Succeedingly, a contact hole 108 is opened in the passivation film 107 with lithography and etching technologies. Subsequently, on all over the passivation film 107 including the contact hole 108, a transparent conductive film is formed as a film. By using lithography and etching technologies, a pixel electrode 109 is formed by patterning this transparent conductive film. Then, the TFT is successfully formed.

Another example for a manufacturing method of a TFT in which four photomasks are used is disclosed in Japanese Patent Laid-open No. 2001-324725 (hereinafter referred to as Patent Document 2). FIG. 2 is a cross-sectional view showing a TFT manufactured by the manufacturing method described in Patent Document 2. In Patent Document 2 as in the Patent Document 1, a gate electrode 101 is formed on an insulating substrate 100. A gate insulating film 102 is formed on the insulating substrate 100 including the gate electrode. Next, a-Si film 103, $n^+$ a-Si film 104 and a metal film for source and drain electrodes are deposited to form a multiple layered film on the gate insulating film 102. By using a resist as mask, the multiple layered film is etched to perform a first patterning of source electrode 106 and drain electrode 105, $n^+$ a-Si film 104 and the a-Si film 103. Thereafter, the thickness of the resist is reduced by oxygen plasma so that the thin resist between the areas forming source and drain electrodes is removed thereby. Then, the TFT is formed through similar processes to Patent Document 1.

When the metal film for the source and drain electrodes, the $n^+$ a-Si film 104 and the a-Si film 103 are etched by dry etching, in accordance with the manufacturing method of a TFT described in Patent Document 1, a difference in level is caused to be formed by the a-Si film 103, $n^+$ a-Si film 104, drain electrode 105 and source electrode 106 as shown in FIG. 1A. A contact hole 108 is opened in a passivation film 107, and a pixel electrode 109 formed of a transparent conductive film such as indium tin oxide (ITO) film is formed. However, there has been a problem where the transparent conductive film of ITO film may be easily broken in the case of a large difference in level incurred.

Meanwhile, as described in Patent Document 1, when the etching of a metal film for the source and drain electrodes is performed by wet etching, the $n^+$ a-Si film 104 and the source 106 and drain 105 electrodes can be formed as a step between them as shown in FIG. 1B. Therefore, as to the TFT in FIG. 1B, the problem of breaking wiring in the transparent conductive film described hereinbefore can be avoided.

As described in Patent Document 2, since the first patterning of the metal film for source and drain electrodes is performed by dry etching and the second patterning is performed by wet etching, a difference in level is formed by the a-Si film 103, $n^+$ a-Si film 104, drain electrode 105 and source electrode 106 as shown in FIG. 2.

As commonly known, when light is irradiated from the transparent insulating substrate side of the TFT substrate, an off-current (leakage current) of the TFT increases due to the light reaching the a-Si film near the drain electrode without being blocked by the gate electrode. The light generates electron-hole pairs in the a-Si film and therefore a leakage current is caused to be generated by electrons and holes flowing attracted by an electric field. Deterioration of the picture quality in a liquid crystal display device is the consequence of the leakage current.

In a condition that the n⁺ a-Si film 104, and the source 106 and drain 105 electrodes are formed as a step between them as a configuration shown in FIG. 1B, the a-Si film 103 protrudes toward the outside of the gate electrode 101, drain electrode 105 and source electrode 106. On the surface of the protruded portion of the a-Si film 103, there exists the n⁺ a-Si film 104. Therefore, due to quick absorption of electrons into the n⁺ a-Si film 104 out of the electron and hole pairs generated by the light in the a-Si film 103, it is not possible to prevent the leakage current.

As in the configuration shown in FIG. 2, there exists the n⁺ a-Si film 104 on the surface of the a-Si film 103 protruded toward the outside from the gate electrode 101, and the source 106 and drain 105 electrodes. The area of n⁺ a-Si film 104 on the protruded a-Si film 103 is smaller than that in FIG. 1B. As a result, in FIG. 2, the amount of charges is reduced because of the recombination of electrons and holes on the back channel side, that is on the surface of the passivation film, among the electrons and holes generated by the light in the a-Si film 103. In other words, the leakage current decreases. Furthermore, when damage is caused by irradiation of ions on the exposed surface of the a-Si film 103 without having any n⁺ a-Si film 104 thereon, the mobility of electrons and holes can be reduced, and it is possible to increase recombination of electrons and holes. Thus, the leakage current can be suppressed.

However, when damage is caused by irradiation of ions on the exposed surface of the a-Si film 103 without having any n⁺ a-Si film 104 thereon, the a-Si film 103 which forms the channel area in the area above the gate electrode 101 also suffers similar damage. Thus, there exits a problem that a non-current is reduced if excess damage is caused to the exposed a-Si film 103 in order to achieve a reduced leakage current.

SUMMARY OF THE INVENTION

The exemplary feature of the present invention is especially to prevent a leakage current and to provide an inversely staggered TFT which maintains an on-current and a manufacturing method thereof.

The TFT of the present invention includes: an insulating substrate; a gate electrode, a gate insulating film and first semiconductor film patterns which are sequentially formed on the substrate; and second semiconductor film patterns including a high density impurity, which are formed on the first semiconductor film patterns separately and which face each other at both sides. The TFT of the present invention further includes a first electrode and a second electrode, each of which is formed on the second semiconductor film patterns which are formed on the first semiconductor film patterns separately and which face each other at both sides. Furthermore, a peripheral portion of the first semiconductor film patterns includes a protruded portion toward the outside from an end portion of the second semiconductor film patterns, and at least a part of the surface in the protruded portion is characterized to be rough. A part of the first semiconductor film patterns is exposed in between the first and second electrodes, and a channel portion of the TFT is constituted thereby. The surface roughness of the roughened portion at the protruded portion of the first semiconductor film patterns is greater than that of the surface on the first semiconductor film patterns at the channel portion. A favorable value in the surface roughness (Rmax) of the roughened surface at the protruded portion of the first semiconductor film patterns is more than or equal to 30 nm.

As to a material of the first semiconductor film patterns of the TFT of the present invention, a-Si is used, and as to a material of the second semiconductor film patterns of the present invention, n⁺ a-Si is used. As to a material of the gate electrode, and the first and second electrodes of the TFT, used is a metal such as Mo, Cr, Ta, Ti, W and Al, or a single film or multiple layers of an alloy of metals, the main component of which includes the respective metals listed above. As a gate insulating film of the TFT of the present invention, a SiN film or a multi-layered film of a $SiO_2$ film and a SiN film is used.

On the insulating substrate of the TFT of the present invention, a passivation film having insulation properties is formed, which further covers the gate insulating film, first semiconductor film, second semiconductor film, and first and second electrodes. On this passivation film, a transparent conductive film such as indium tin oxide (ITO) film is formed, and this transparent conductive film is electrically connected to either the first or second electrode of the TFT through an opening hole formed in the passivation film.

A manufacturing method of a TFT of the present invention includes the steps of: forming a multi-layered film of a first semiconductor film, a second semiconductor film including a high density impurity, and a metal film, on a gate insulating film, after forming a gate electrode and the gate insulating film on an insulating substrate; forming resist film patterns on the metal film; forming multi-layered film patterns constituted of the first semiconductor film, the second semiconductor film and the metal film, by etching the multiple layered film using the resist film patterns as a mask; selectively removing by etching a part of the resist film patterns in the layer above the area of the first semiconductor film to be formed as a channel of the TFT; separating into a first electrode and a second electrode by selectively etching the metal film in the multi-layered film patterns using the remaining resist film patterns as a mask; forming a channel portion by removing the second semiconductor film by etching using the resist film patterns as mask, the second semiconductor film in the multi-layered film patterns exposed between the first and second electrodes, and by exposing the first semiconductor film, and at the same time protruding a periphery portion of the first semiconductor film from an end portion of the second semiconductor film by side etching the first electrode, second electrode and second semiconductor film; roughening the surface of the protruded portion in the periphery of the first semiconductor film at the time when removing the resist film; and, then forming a passivation film all over the surface over the insulating substrate.

In the step of forming the resist film patterns on the multi-layered film in the manufacturing method of the TFT of the present invention described above, the resist film patterns are formed to have the thickness of the area between the first and second electrodes smaller than that of the areas of the first and second electrodes.

In the manufacturing method of a TFT of the present invention described above, the channel portion is intended to be formed by removing the second semiconductor film by etching with the resist film patterns as a mask after the separation step of the first and second electrodes so that the first semiconductor film will be exposed. However, the channel portion may also be formed by removing the second semiconductor film by etching with the separately formed first and second electrodes as a mask after removal of the resist film patterns so that the first semiconductor film will be exposed.

In the manufacturing method of a TFT the present invention described above, it is possible, after the step of forming the passivation film, to further include steps of: forming an opening to reach the first electrode or second electrode and the gate electrode; and, forming a transparent conductive film on the passivation film and then electrically connecting the transparent conductive film to either the first or second electrode and to the gate electrode.

In the manufacturing method of a TFT of the present invention described above, the surface roughness of the roughened portion of the first semiconductor film, the portion protruding from the end portion of the second semiconductor film, is intended to be greater than that of the surface on the first semiconductor film at the channel area. A favorable value in the surface roughness (Rmax) of the roughened surface at the protruded portion of the first semiconductor film described above is more than or equal to 30 nm.

In the manufacturing method of a TFT of the present invention described above, as to the first semiconductor film, a Si is used and, as to the second semiconductor film, $n^+$ a-Si is used.

In the TFT of the present invention, since the surface roughness of the first semiconductor film at the protruded portion described above toward the passivation film is intended to be greater than that of the surface on the first semiconductor film at the channel portion, the mobility of holes generated by the light in the first semiconductor film can be suppressed to a lower value. Furthermore, due to the increase in recombination of electrons and holes on the surface toward the passivation film at the periphery of the first semiconductor film, it is possible to suppress the leakage current of the TFT.

In the TFT of the present invention, by adopting a configuration in which the periphery of the first semiconductor film contacts with the passivation film, the difference in level between the first and second electrodes and the semiconductor films (the first and second semiconductor films) is reduced. Furthermore, the TFT adopts a configuration in which the surface toward the passivation film at the periphery of the first semiconductor film is roughened. The following merits are obtained when the TFT according to the configuration described above is applied to a liquid crystal display device.

(1) Breaking of patterns such as picture electrodes formed on the TFT passivation film can be prevented.
(2) Liquid crystal display devices with a suppressed light leak current while the on-current of the TFT being maintained can be obtained.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

Figure 1A:
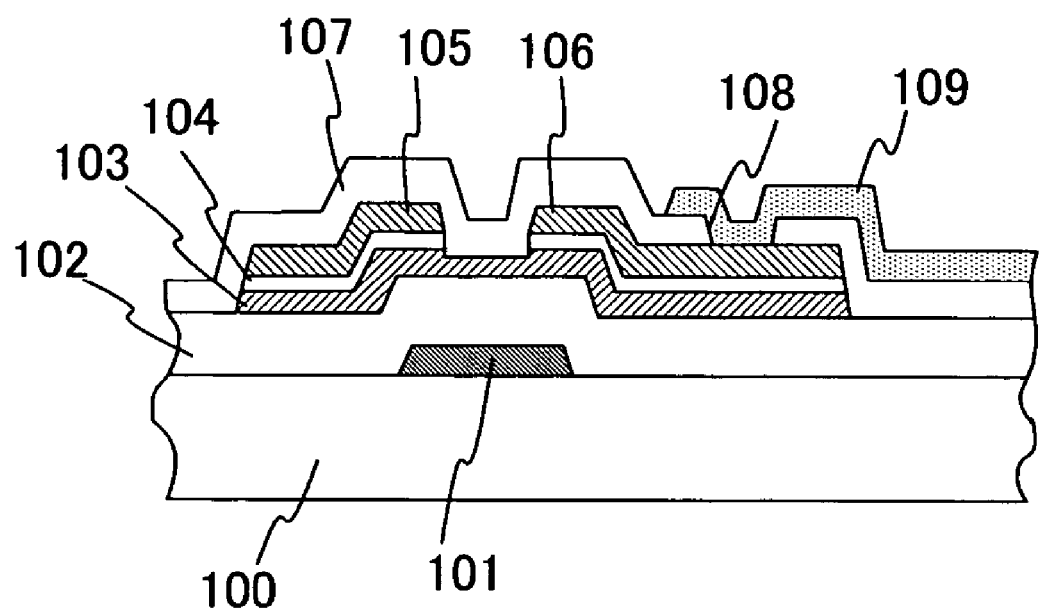
FIGS. 1A and 1B are cross-sectional views showing a conventional TFT.
Figure 1B:
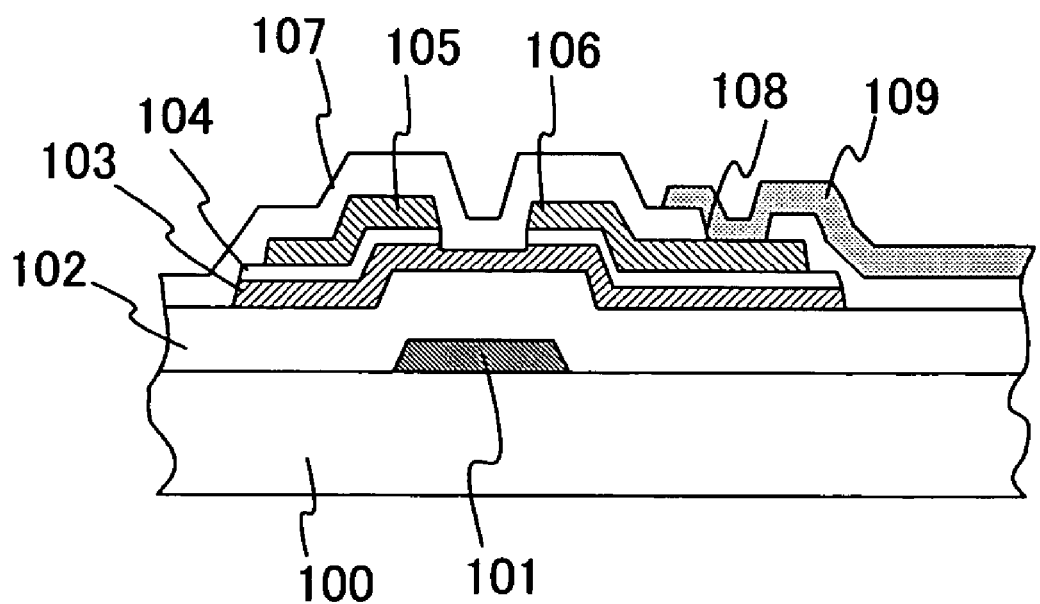
Figure 2:
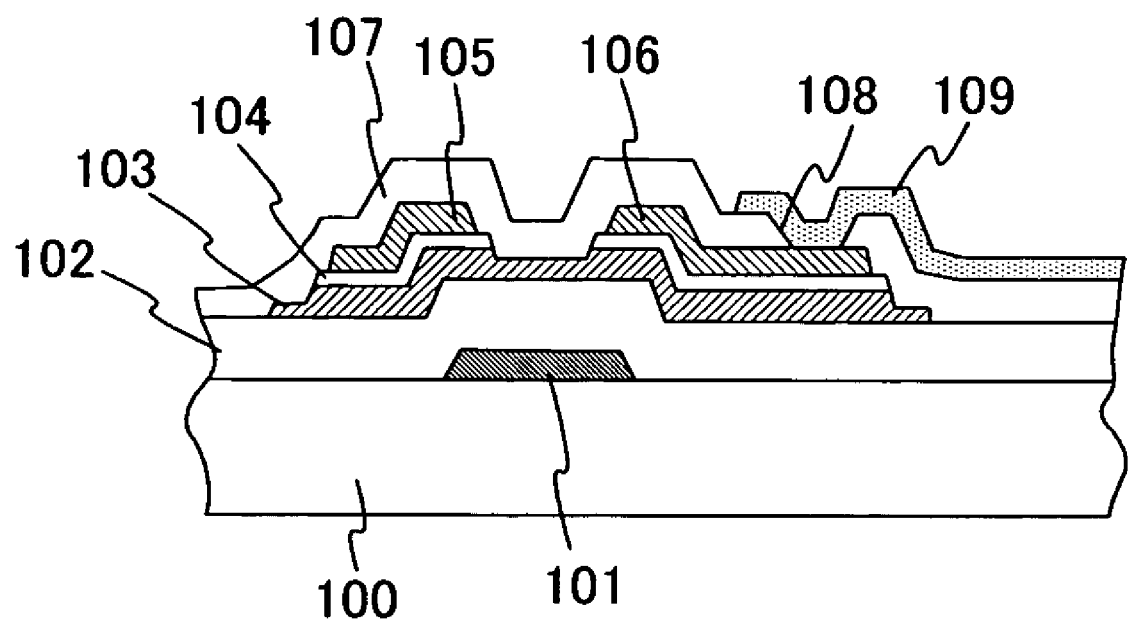
FIG. 2 is a cross-sectional view showing another conventional TFT.

Hereinafter, embodiments of a TFT of the present invention will be described with reference to the drawings.

With reference to FIGS. 3A, 3B, 4A and 4B, a TFT of the present invention includes: a transparent insulating substrate 1 such as glass; and a gate electrode 2, a gate insulating film 3 and first semiconductor film patterns 4 which are formed sequentially on the substrate. In the TFT of the present invention, second semiconductor film patterns 5 including a high density impurity are provided separately on the first semiconductor film patterns 4, and face each other at both sides. Then, a source electrode 6A and drain electrode 6B are provided on the second semiconductor film patterns 5 which are provided separately and which face each other at both sides. A portion of the first semiconductor film patterns 4 between the source electrode 6A and drain electrode 6B becomes a channel portion of the TFT.

Further, the TFT of the present invention includes: a passivation film 7, having insulation properties, which covers the source electrode 6A and drain electrode 6B over the transparent insulating substrate 1; and a pixel electrode 9 which is formed in the passivation film 7 and is electrically connected to the source electrode 6A through a contact hole 8 opened through the passivation film 7. The first semiconductor patterns 4 for the TFT of the present invention protrudes from an end portion of the second semiconductor film patterns 5 toward the outside, and the surface of the protruded portion of the first semiconductor film patterns 4 (hereinafter, semiconductor film protruded portion 4A) contacts with the passivation film 7. In the TFT of the present invention, based on the provision of the semiconductor film protruded portion 4A, the difference in level between the source and drain electrodes and the multi-layered film patterns 5 constituting of the first semiconductor patterns 4 and second semiconductor patterns can be reduced. As a result, pattern breaking of the pixel electrode 9 which is formed on the passivation film 7 can be prevented.

The surface toward the passivation film 7 of the semiconductor film protruded portion 4A is roughened. The surface roughness of the roughened surface of the semiconductor film protruded portion 4A is intended to be greater than that of the first semiconductor film patterns 4 which form the channel area. By making the surface roughness of the semiconductor film protruded portion 4A greater than that of the surface of the first semiconductor film patters 4 which form the channel area, the mobility of holes generated by the light in the first semiconductor film patterns can be suppressed to a lower value. Furthermore, due to the increase in recombination of electrons and holes on the surface (toward the passivation film) at the periphery of the first semiconductor film patterns 4, it is possible to suppress the leakage current of the TFT. Note that there is no need to roughen the entire surface of the semiconductor film protruded portion 4A, but a similar effect can be obtained by roughing a part (for instance, 30% or more) of it.

As to a material for the gate electrode 2, used is a metal material including at least one element selected from Mo, Cr, Ta, Ti, Al and W, for example. The gate electrode 2 is formed as a film of 200 to 300 nm thickness by sputtering and the like.

As to the gate insulating film 3, SiN film or a multi-layered film of $SiO_2$ film and SiN film is used, and the gate insulating film 3 is formed as a film of 350 to 500 nm thickness by plasma CVD.

As to a material for the source 6A and drain 6B electrodes, used is a metal material including at least one element selected from Mo, Cr, Ta, Ti, Al and W, and these electrodes are formed as a film of 200 to 300 nm thickness by sputtering and the like.

As to the first semiconductor film 4, a-Si is used, and the first semiconductor film 4 is formed as a film of 100 to 250 nm thickness by plasma CVD. Furthermore, as to the second semiconductor film 5, $n^+$ a-Si doped with phosphorus is used, and the second semiconductor film 5 is formed as a film of 20 to 50 nm thickness by plasma CVD.

As to the passivation film 7, an insulating film such as SiN is used, and the passivation film 7 is formed as a film of 300 to 400 nm thickness by plasma CVD. Furthermore, as to a material for the pixel electrode 9, an indium tin oxide film (ITO film) is used, and the pixel electrode 9 is formed as a film of 40 to 140 nm thickness by sputtering and the like.

Hereinafter, with an exemplary example, the manufacturing method of a TFT of the present invention is described.

EXEMPLARY EXAMPLE 1

Figure 3A:
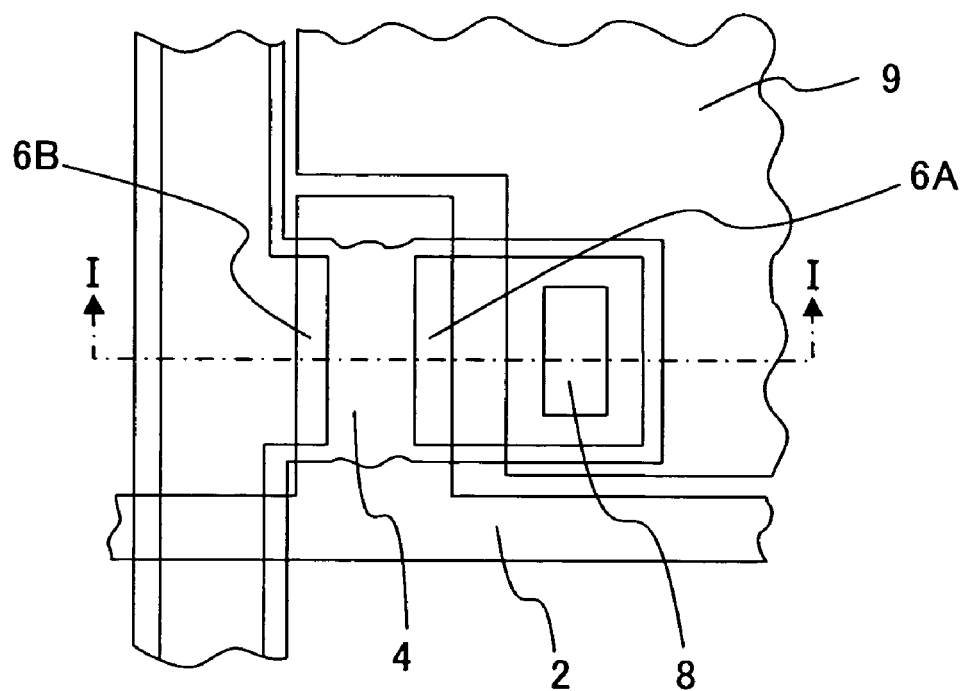
FIG. 3A is a plan view showing a TFT of an embodiment of the present invention.
Figure 3B:
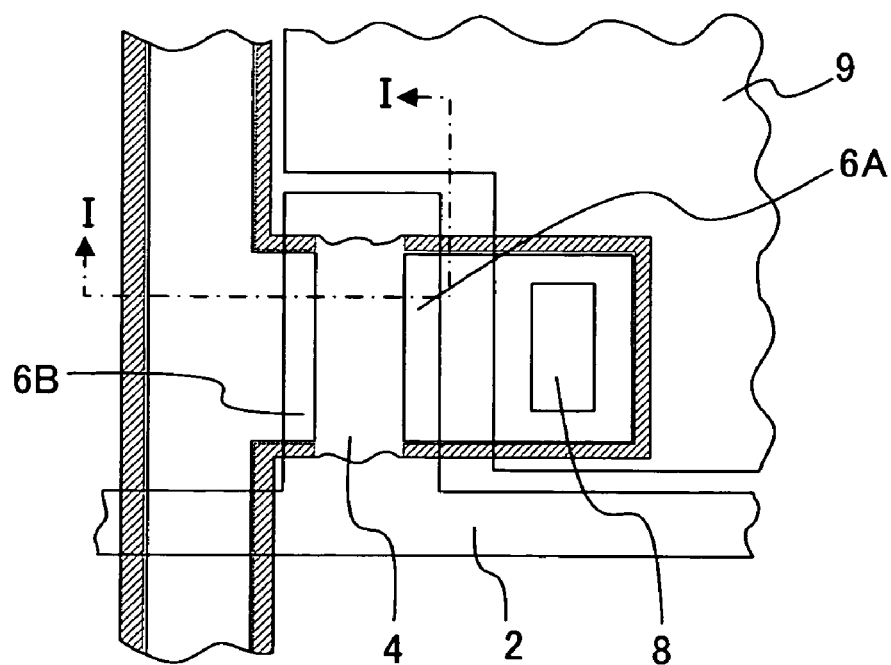
FIG. 3B is a plan view showing a peripheral surface of a first semiconductor film of the TFT in the embodiment of the present invention except a channel area, by use of slant lines.
Figure 4A:
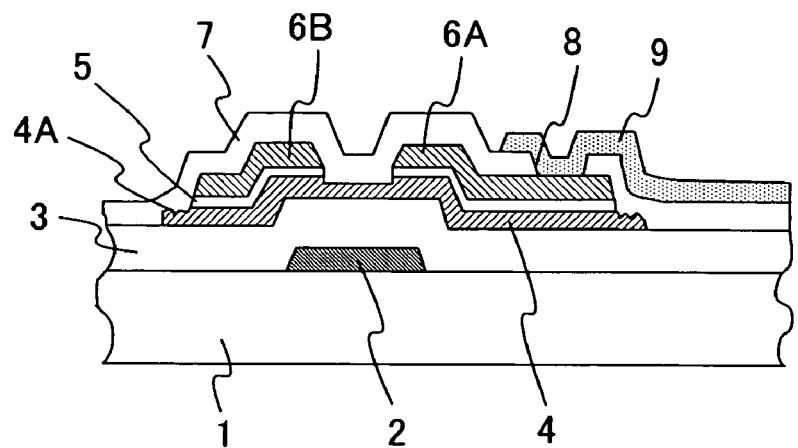
FIG. 4A is a cross-sectional view taken along the I-I line of FIG. 3A.
Figure 4B:
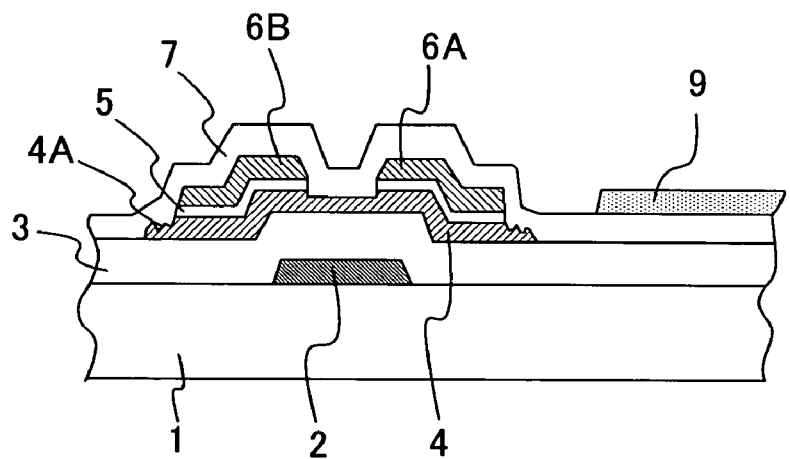
FIG. 4B is a cross-sectional view taken along the I-I line of FIG. 3B.
Figure 4C:
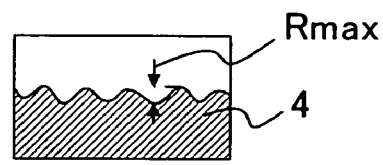
FIG. 4C is an enlarged fragmentary sectional view of a peripheral surface of the semiconductor film of FIG. 3A, except the channel area.

Regarding the manufacturing method of the TFT in FIG. 3A, a description is given with reference to FIGS. 5A to 5D, FIGS. 6A to 6C and FIG. 7.

Figure 5A:
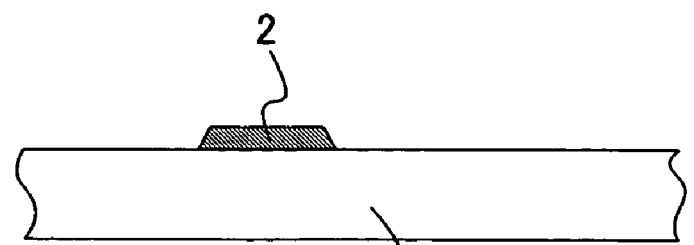
FIGS. 5A to 5D are cross-sectional views showing a first example of a TFT manufacturing method of the present invention in respective steps.
Figure 5B:
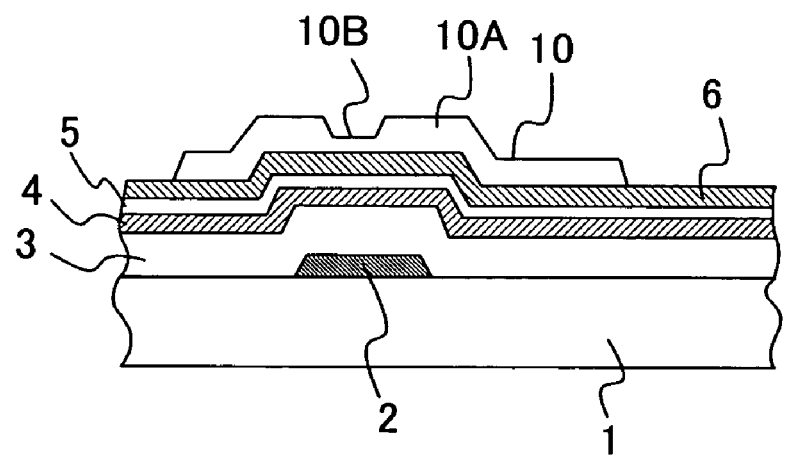

First, as shown in FIG. 5A, on a transparent insulating substrate 1 such as a glass substrate, a metal film such as a film of Mo, Cr and Mo—W, or a multi-layered film such as an alloy film of Ta-Al and Mo film is formed as a film of 200 to 300 nm thickness by sputtering and the like. A gate electrode 2 is formed by patterning this metal film by lithography and etching technologies. Next, as shown in FIG. 5B, on the transparent insulating substrate 1, sequentially formed are: a gate insulating film 3 of 350 to 500 nm thickness which is constituted of either a SiN film or a multi-layered film of a $SiO_2$ film and a SiN film; and a first semiconductor film 4 of a-Si, the thickness thereof being 100 to 250 nm. Furthermore, on the first semiconductor film 4, a second semiconductor film 5 of 20 to 50 nm thickness, including a high density impurity, constituted of $n^+$ a-Si doped with phosphorus is formed.

Figure 7:
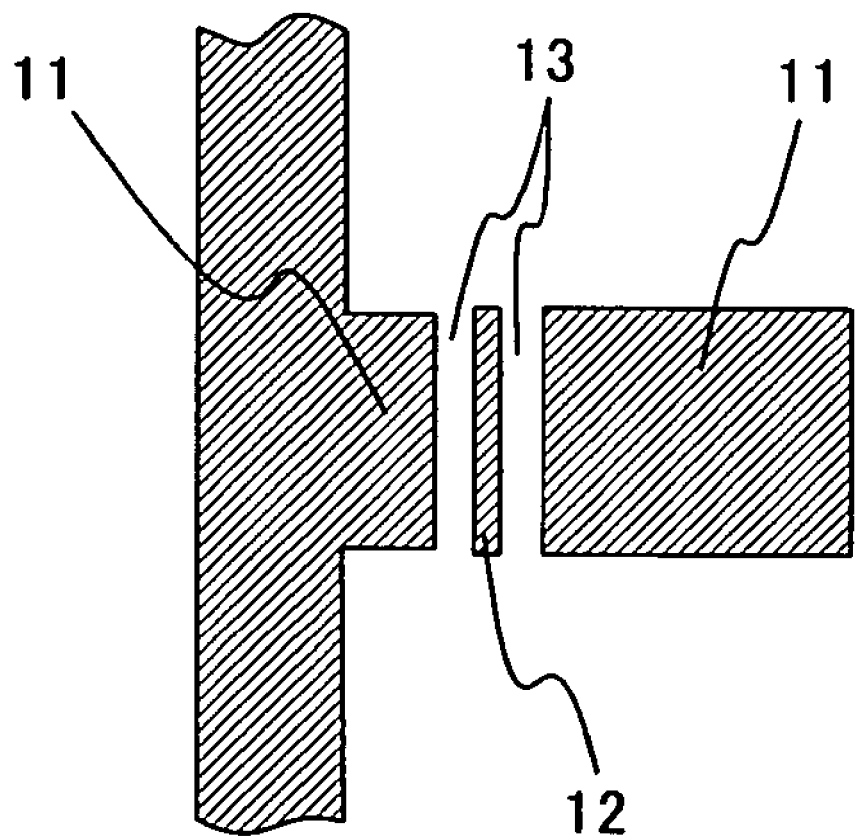
FIG. 7 is a view showing a photomask pattern to be used in the manufacturing of a TFT of the present invention.

Next, as a metal film 6 for the source and drain electrodes, formed is a metal film of such as Mo, Cr, Ta, Ti, Mo and W, or a multi-layered film constituted of Mo and Al, the film having thickness of 200 to 300 nm, on the second semiconductor film 5 by sputtering. Thereafter, on the metal film 6, a positive type photoresist of 1 to 2 μm thickness is coated. Next, exposure and development are performed by the use of a photomask pattern, as shown in FIG. 7, having a transparent area, a pair of shading areas 11 which are source and drain forming areas, and a semitransparent area constituted of an oblong rectangle 12 and slits 13. At this point of time, the resist under the transparent area of the photomask is removed, and the other part of the resist under the shaded areas is formed to have the thickness almost the same as that when it has been coated. The amount of exposure is controlled such that the thickness of the resist under the semitransparent area constituted of the oblong rectangle and slits, which are constitued in dimensions below the resolution limit of exposure apparatus for the photomask, becomes about 20 to 60% that of the resist under the shaded area, for example, about as thin as 200 to 600 nm. As described hereinbefore, as shown in FIG. 5B, a resist 10 which is constituted of resists 10A for source and drain forming areas and a thin resist 10B for a channel forming area is formed on the metal film 6.

Figure 5C:
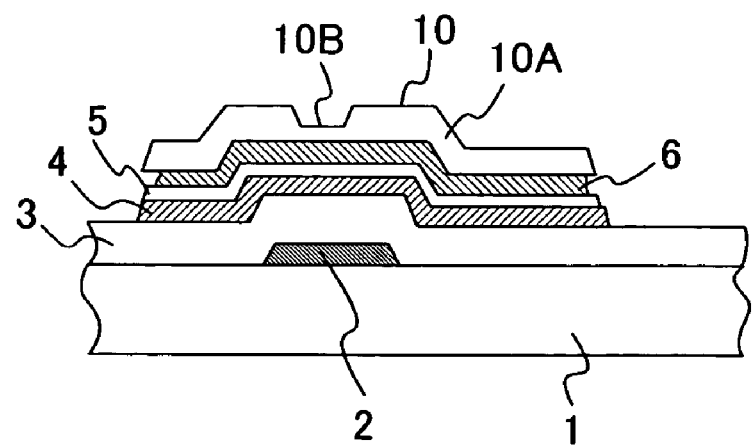

Next, as shown in FIG. 5C, patterning is performed on the metal film 6 using the resist 10 as mask by isotropic dry etching or wet etching. For example, if the metal film 6 consists of Cr, wet etching is performed with $CeNHO_3$ etchant. Further, if the metal film 6 consists of Mo, isotropic dry etching is performed with a gas of either $SF_6$ or $CF_4$, which includes $O_2$ as a mixture, or alternatively with a gas of $CF_4$ including HCl. Thereafter, an exposed portion constituted of the second semiconductor film 5 composed of $n^+$ a-Si and the first semiconductor film 4 composed of an a-Si film is removed by anisotropic dry etching with a gas of either $SF_6$ or $CF_4$, which includes either HCl or $Cl_2$. Here, as shown in FIG. 5C, the portion that is the thin resist 10B for forming the channel area stays remained.

Figure 5D:
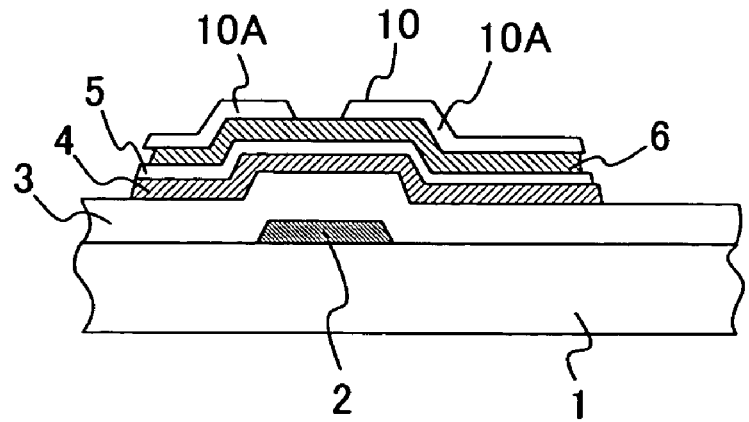

Next, the portion that is the thin resist 10B for forming the channel area is removed by dry ashing with an $O_2$ gas. Etching will be terminated when the thin resist 10B for forming the channel area is completely removed. As shown in FIG. 5D, the resists 10A for forming the source and drain electrode areas stay remained.

Figure 6A:
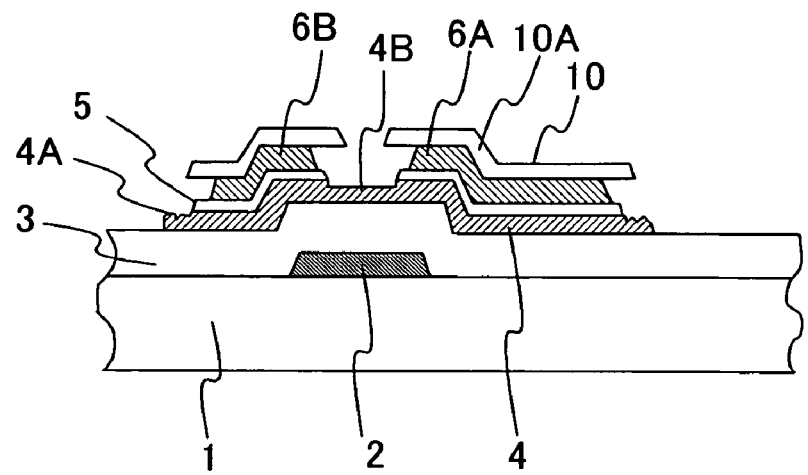
FIGS. 6A to 6C are cross-sectional views showing the first example of the TFT manufacturing method of the present invention in respective steps following FIG. 5D.

Thereafter, a second patterning of the metal film 6 and the second semiconductor film 5 is performed by etching in the same way as for the first patterning which involves the metal film 6 and the second semiconductor film 5. Due to this etching, the metal film 6 becomes separated and the source electrode 6A and the drain electrode 6B are formed. Subsequently, the second semiconductor film 5 is etched by reactive ion etching which is one of the anisotropic dry etching techniques. Here, as shown in FIG. 6A, a certain film thickness, such as 50 to 80% of the film originally formed, is left over by etching a part of the surface of the first semiconductor film 4 consisting of an a-Si film so that a channel area 4B is formed. Through a series of etching steps the metal film 6 and the second semiconductor film 5 are subjected to side etching. As a result, as shown in FIG. 6A, the first semiconductor film becomes protruding from an end portion of the second semiconductor film 5 to the outside. Reference numeral 4A in FIG. 6A indicates a protruded portion of the first semiconductor film 4.

Figure 6B:
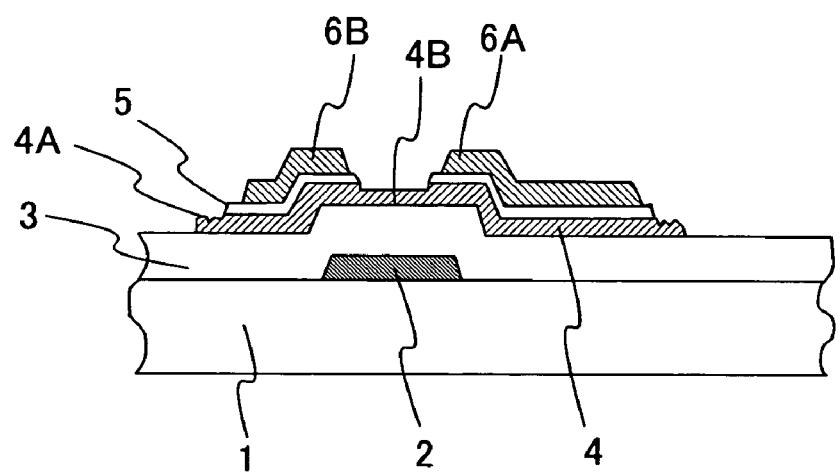

Subsequently, as shown in FIG. 6B, the resist 10 is removed. The surface of the protruded portion 4A of the first semiconductor film 4 is exposed to the dry ashing with an $O_2$ gas for removal of the thin resist used for forming the channel area, and then the film 4 is subjected to reactive ion etching. Thus, the surface thereof is roughened compared with that of the channel area. It was observed that the surface of the area 0.4 μm inward from the outermost circumference of the first semiconductor film 4 was roughened.

Figure 6C:
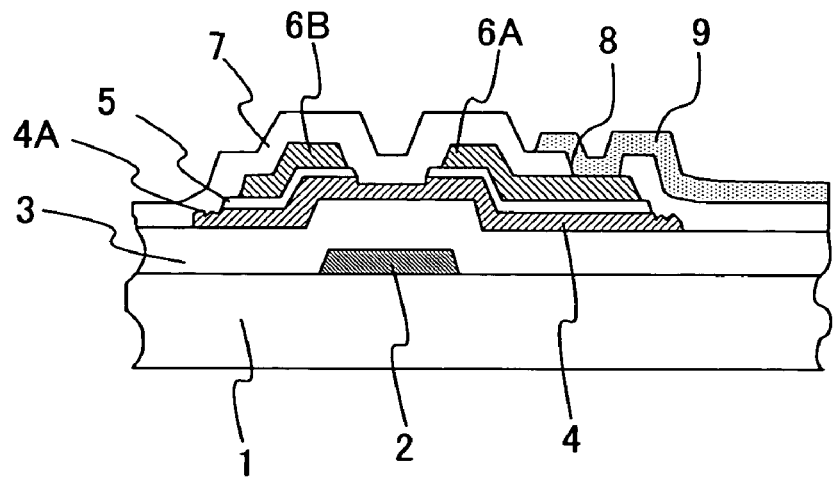

Next, a passivation film 7 consisting of SiN is formed as a film of 300 to 400 nm thickness by plasma CVD, and a contact hole 8 is opened in the passivation film 7 by lithography and etching technologies. Then, an ITO film is formed by sputtering as a film of 40 to 140 nm thickness on the passivation film 7 including the contact hole 8. A pixel electrode 9 electrically connected to the source electrode 6A is formed by patterning this ITO film, and the TFT shown in FIG. 6C is manufactured.

EXEMPLARY EXAMPLE 2

Figure 8A:
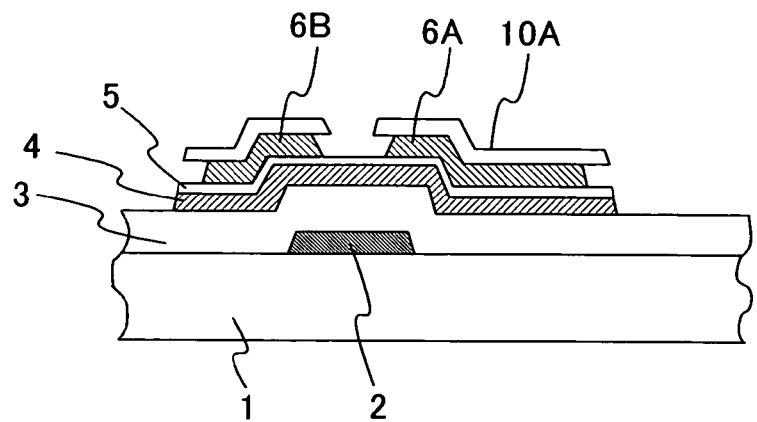
FIGS. 8A to 8C are cross-sectional views during steps showing a second example of the TFT manufacturing method of the present invention.
Figure 8B:
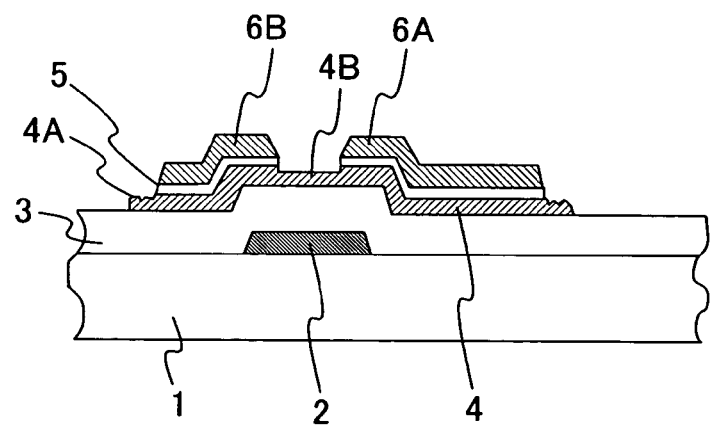
Figure 8C:
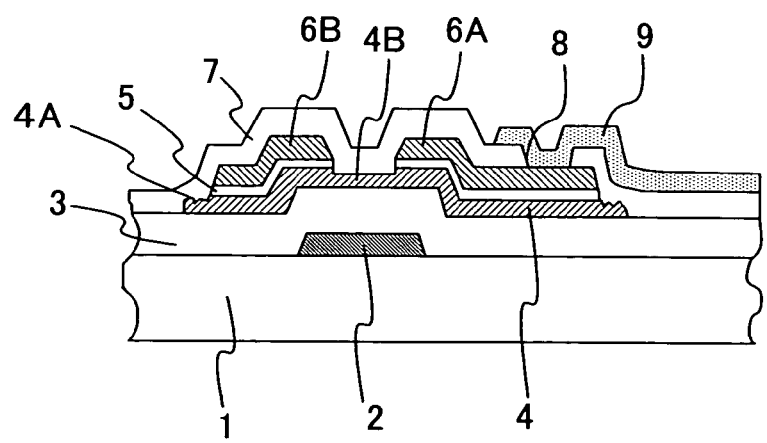

FIGS. 8A to 8C are cross-sectional views during steps describing a manufacturing method of a second exemplary example of the TFT of the present invention. In the first exemplary example, the resist 10A for forming the source and drain electrode areas are removed after performing the second patterning of the metal film 6 and the second semiconductor film 5 and after performing etching of a part of the surface of the first semiconductor film 4. In the second exemplary example, as shown in FIG. 8A, a second patterning (side etching) of a metal film including a source electrode 6A and a drain electrode 6B is performed.

Thereafter, the resists 10A are removed. Then, as shown in FIG. 8B, the second semiconductor film 5 formed of $n^+$ a-Si is etched using the source electrode 6A and the drain electrode 6B as mask. It was observed that, in the first semiconductor film 4 formed of a-Si, the surface was caused to be exposed to the area 1.5 μm inward from the outermost circumference thereof, and the exposed surface was roughened. Reference numeral 4B in FIG. 8B indicates a channel area, and reference numeral 4A indicates the protruded portion protruding from an end portion of the second semiconductor film 5 to the outside caused by the series of etching steps.

Thereafter, as in the case of the first exemplary example, the TFT as shown in FIG. 8C is manufactured through the following steps: opening a contact hole 8 in a passivation film 7 after forming the passivation film 7 of SiN by the plasma CVD; then, forming an ITO film on the surface of the passivation film 7 including the contact hole 8; and, forming a pixel electrode 9 by patterning the ITO film by use of lithography and etching technologies.

When the surface roughness of the first semiconductor film formed by a-Si which forms the channel area 4B in between the source electrode 6A and the drain electrode 6B was measured with a scanning electron microscope and an atomic force microscope (AFM), the maximum roughness (Rmax) of less than or equal to 20 nm was obtained. The surface roughness of the first semiconductor film protruded portion 4A formed by a-Si is set to be larger than that of this channel area. The surface roughness (Rmax) of the protruded portion 4A shall be preferably not less than 30 nm. Compared with the case where the surface roughness (Rmax) is less than or equal to 30 nm, if the surface roughness (Rmax) of the semiconductor film protruded portion 4A is more than 30 nm, it is observed that generation of the leakage current is suppressed and the on-current is not reduced. Note that the upper limit of the surface roughness (Rmax) of the protruded portion 4A of the first semiconductor film is not specifically limited, but the upper limit is normally about 100 nm in consideration of the initial thickness of the first semiconductor film.

Further, in the examples above, the surface roughness in the periphery of the semiconductor film is increased through the steps of exposing under $O_2$ plasma with dry ashing using an $O_2$ gas, and subsequent dry etching. However, a similar effect can be obtained by other processing, such as nitrogen plasma and plasma processing with rare gas besides $O_2$ plasma, or injection of $O_2$ ion.

Further, the inventor's intent is to retain all equivalents of the claimed invention even if the claims are amended during prosecution.

The TFTs formed in the examples 1 and 2 were used for an active matrix liquid crystal display device. It was observed that there was not any breaking of the patterns in pixel electrodes, and the quality of displayed picture was stable.

While this invention has been described in connection with certain preferred embodiments, it is to be understood that the subject matter encompassed by way of this invention is not to be limited to those specific embodiments. On the contrary, it is intended for the subject matter of the invention to include all alternatives, modifications and equivalents as can be included within the spirit and scope of the following claims.

What is claimed is:

1. A thin film transistor comprising:
an insulating substrate;
a gate electrode, a gate insulating film and first semiconductor film patterns, which are sequentially formed on the insulating substrate;
second semiconductor film patterns including a high density impurity, which are provided separately on the first semiconductor film patterns, and which face each other at both sides; and
a first electrode and a second electrode, each of which is formed on the second semiconductor film patterns which face each other,
wherein an area of the first semiconductor film patterns between the first electrode and the second electrode configures a channel portion of the thin film transistor; and
wherein the first semiconductor film patterns include a protruded portion protruding toward the outside from an end portion of the second semiconductor film patterns such that the protruded portion is extended from the end portion located on a remote side from the channel portion, and at least a part of the surface in the protruded portion of the first semiconductor film patterns having a rougher surface compared with a surface of the first semiconductor film of the channel portion.

2. The thin film transistor according to claim 1, wherein a material of the first semiconductor film patterns comprises amorphous silicon, and a material of the second semiconductor film patterns comprises $n^+$ type amorphous silicon.

3. The thin film transistor according to claim 1, wherein a material of the gate electrode, the first electrode and the second electrode includes at least one element selected from Al, Mo, Cr, Ta, Ti and W.

4. The thin film transistor according to claim 1, wherein the gate insulating film is one selected from SiN film and a multi-layered film of $SiO_2$ film and SiN film.

5. The thin film transistor according to claim 1, wherein, on the insulating substrate, a passivation film is further formed covering the gate insulating film, the first semiconductor film patterns, the second semiconductor film patterns, the first electrode and the second electrode.

6. The thin film transistor according to claim 5, wherein a transparent conductive film is formed on the passivation film, and the transparent passivation film is electrically connected to either one of the first electrode and the second electrode through an opening formed in the passivation film.

7. The thin film transistor according to claim 6, wherein the transparent conductive film comprises an indium tin oxide film.

8. The thin film transistor according to claim 5, wherein the passivation film comprises SiN.

9. The thin film transistor according to claim 1, wherein the protruded portion of the first semiconductor film patterns protrudes beyond the second semiconductor film patterns.

10. The thin film transistor according to claim 1, wherein the first electrode or the second electrode comprises a drain electrode.

11. The thin film transistor according to claim 10, wherein the second semiconductor film patterns protrude beyond the drain electrode.

12. The thin film transistor according to claim 11, wherein the protruded portion of the first semiconductor film patterns protrudes beyond the drain electrode.

* * * * *